(12) United States Patent
Tsironis

(10) Patent No.: US 8,203,348 B1
(45) Date of Patent: Jun. 19, 2012

(54) AUTONOMOUS IMPEDANCE TUNER WITH HUMAN CONTROL INTERFACE

(76) Inventor: Christos Tsironis, Kirkland (CA)

( * ) Notice: Subject to any disclaimer, the term of this patent is extended or adjusted under 35 U.S.C. 154(b) by 474 days.

(21) Appl. No.: 12/453,194

(22) Filed: May 1, 2009

(51) Int. Cl.
*G01R 27/04* (2006.01)
(52) U.S. Cl. ....... 324/638; 324/637; 324/642; 333/17.3; 333/333; 333/263
(58) Field of Classification Search .................. 324/638
See application file for complete search history.

(56) References Cited

U.S. PATENT DOCUMENTS

| | | | | |
|---|---|---|---|---|
| 4,853,839 | A * | 8/1989 | Nichols et al. ................. | 700/61 |
| 6,136,388 | A * | 10/2000 | Raoux et al. ................. | 427/569 |
| 6,674,293 | B1 * | 1/2004 | Tsironis ....................... | 324/638 |
| 6,845,126 | B2 * | 1/2005 | Dent et al. .................... | 375/219 |
| 6,850,076 | B2 * | 2/2005 | Tsironis ....................... | 324/637 |
| 7,034,629 | B2 * | 4/2006 | Tsironis ....................... | 333/17.3 |
| 7,548,069 | B2 * | 6/2009 | Simpson ....................... | 324/537 |
| 7,646,268 | B1 * | 1/2010 | Tsironis ....................... | 333/263 |
| 2002/0030683 | A1 * | 3/2002 | Alexander ................. | 345/440.1 |
| 2003/0122633 | A1 * | 7/2003 | Tsironis ....................... | 333/17.3 |
| 2003/0193997 | A1 * | 10/2003 | Dent et al. .................... | 375/219 |
| 2006/0017530 | A1 * | 1/2006 | Boulerne ....................... | 333/263 |
| 2007/0052505 | A1 * | 3/2007 | Simpson ....................... | 333/263 |
| 2007/0053513 | A1 * | 3/2007 | Hoffberg ....................... | 380/201 |
| 2007/0171008 | A1 * | 7/2007 | Boulerne ....................... | 333/263 |
| 2007/0197180 | A1 * | 8/2007 | McKinzie et al. ......... | 455/248.1 |
| 2008/0048673 | A1 * | 2/2008 | Tan et al. .................... | 324/601 |
| 2009/0146757 | A1 * | 6/2009 | Vellas et al. .................... | 333/33 |
| 2009/0231054 | A1 * | 9/2009 | Boulerne ....................... | 333/17.3 |
| 2009/0267588 | A1 * | 10/2009 | Schmitz et al. .............. | 323/352 |

FOREIGN PATENT DOCUMENTS

JP 07151512 A * 6/1995

OTHER PUBLICATIONS

Product Note 41: "Computer Controlled Microwaves Tuenr, CCMT" Focus Microwaves Inc. Jan. 1998.
Maury Microwave Corp. "Precision Microwave Instruments and Componenets Product Catalogue" 2001, p. 158.
Product Note 79: "MPT, a Universal Multi-Purpose Tuner" Focus Microwaves, Oct. 2004.
"Rabbit", Microprocessor, 8-bit Rabbit Micro-processor series, Copyright (c) 2009 Rabbit Apr. 27, 2009.
"Rugged Operator Interface & Mobile Data Terminals", QSI Corporation, QTERM-Z260.
Product Note 82: "VSWR++ iTuner Calibration Routine", Focus Microwaves, Jan. 2007.
"Network Analyzer> PNA Family of Microwave Network Analyzers", Agilent Technologies, Copyright Agilent 2000-2009.

* cited by examiner

*Primary Examiner* — Timothy J Dole
*Assistant Examiner* — Benjamin M Baldridge

(57) ABSTRACT

An electro-mechanical microwave impedance tuner operates as a stand-alone instrument and includes on-board digital processor, firmware, memory, digital display and human control interface, in form of a joystick, mouse, keyboard or tactile (touch sensitive) screen in order to recognize and execute commands for moving the tuner motors and probes, generating required microwaves impedances and calculating losses and de-embedding to reference planes different than the tuner ports. Before being used in operations the tuner can also be controlled by a control computer in order to be calibrated on a network analyzer and the data can be uploaded into the on-board memory in order to be used in the above calculations. During measurement and tuning operations the tuner is therefore stand-alone and totally independent of a control computer.

10 Claims, 10 Drawing Sheets

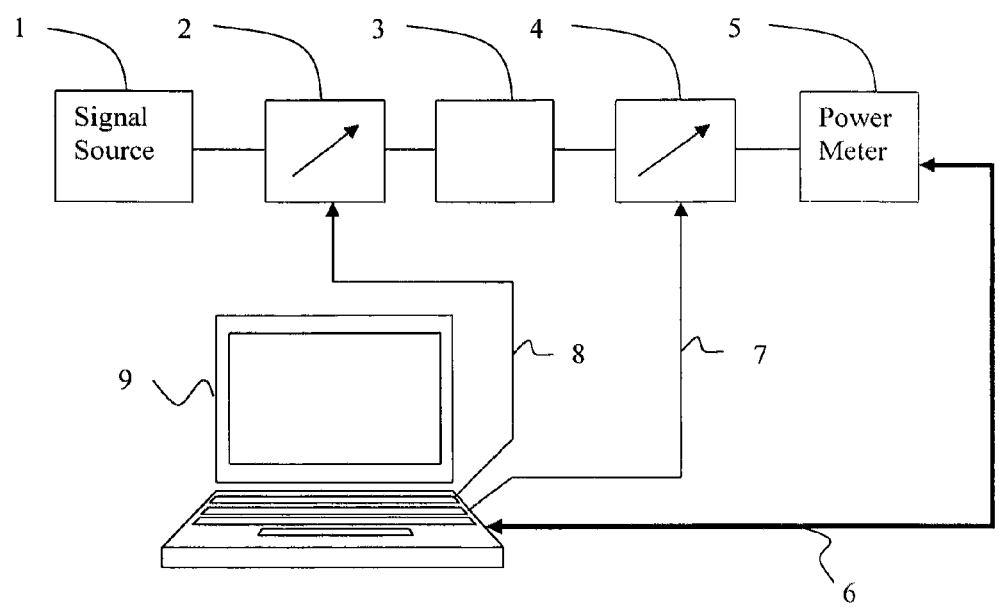
FIGURE 1: Prior art: Automated Load Pull Test System using Impedance Tuners

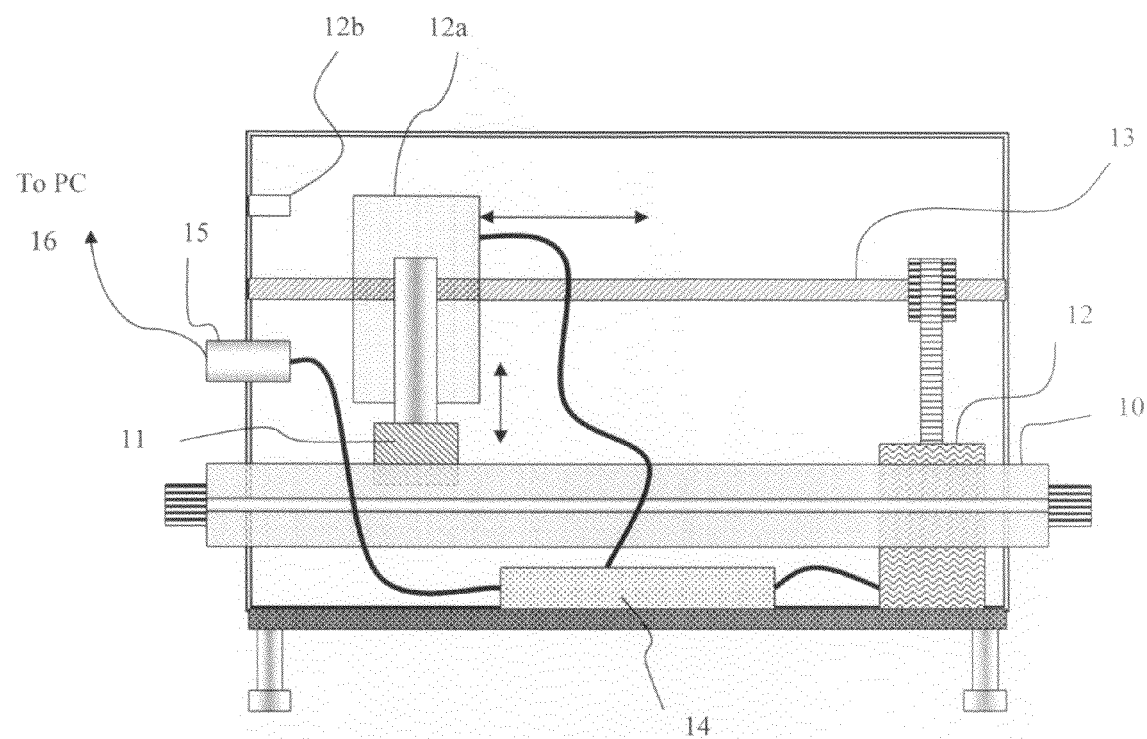
FIGURE 2: Prior art: Cross section of wideband electromechanical tuner

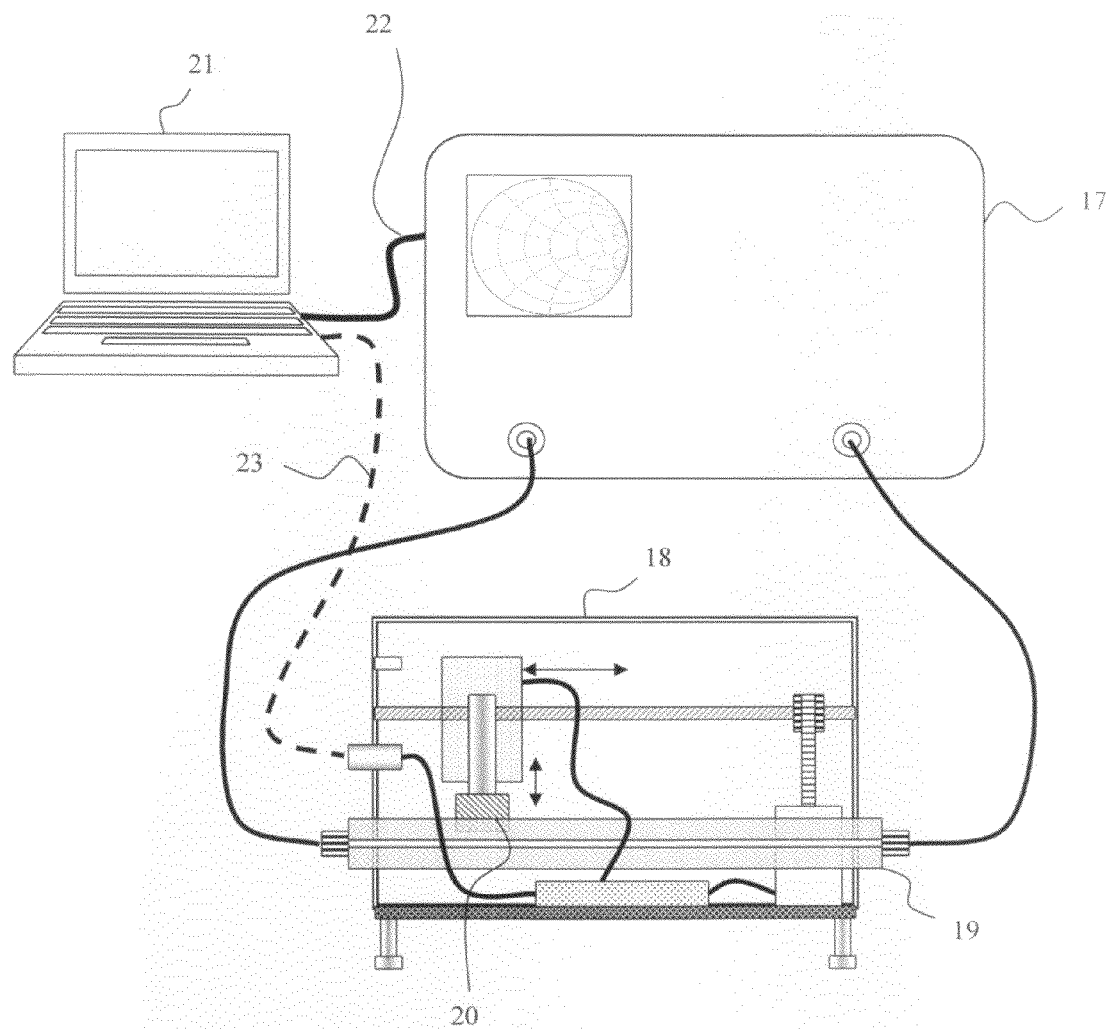
FIGURE 3: Prior art: Setup for calibrating an impedance tuner on a VNA

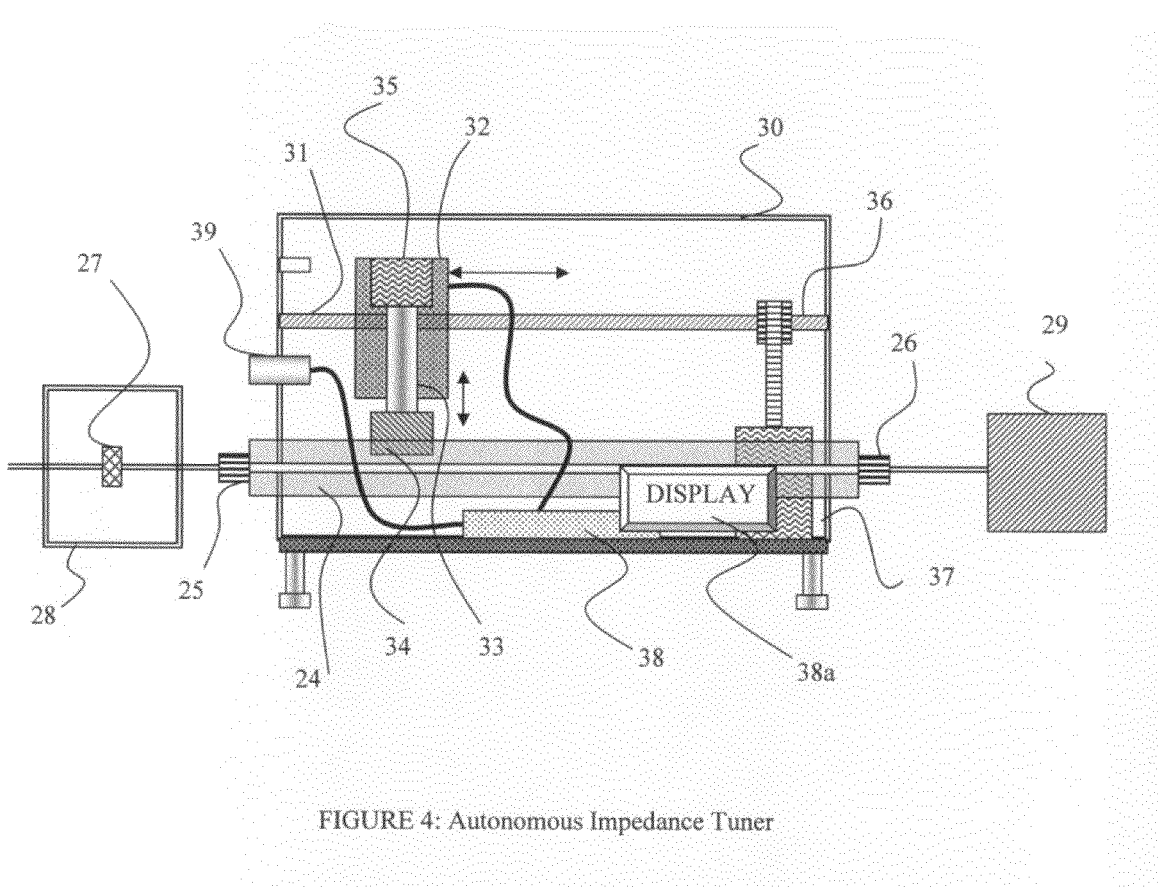
FIGURE 4: Autonomous Impedance Tuner

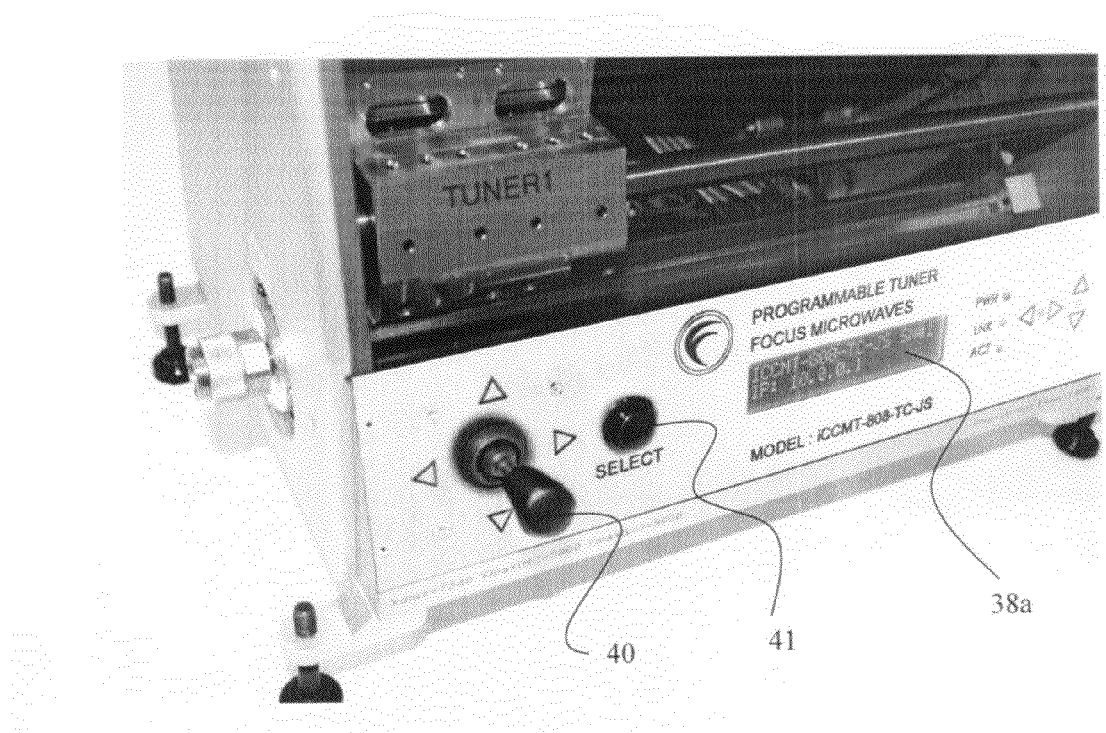
FIGURE 5: Actual photo of autonomous impedance tuner and human control interface (joystick), showing also the alpha-numeric display.

- MOVE X, Y

- INITIALIZE (= GO TO X=0, Y=0)

- LOAD A CALIBRATION FILE

- LOAD A SETUP FILE

- CHOOSE DISPLAY o REAL IMAG o XPOS, YPOS o AMPLITUDE(Γ), PHASE(Γ)

- TUNE TO o REAL, IMAG o AMPLITUDE(Γ), PHASE(Γ)

- START VSWR (VALUE) ROUTINE

FIGURE 6: Menu of selectable firmware options

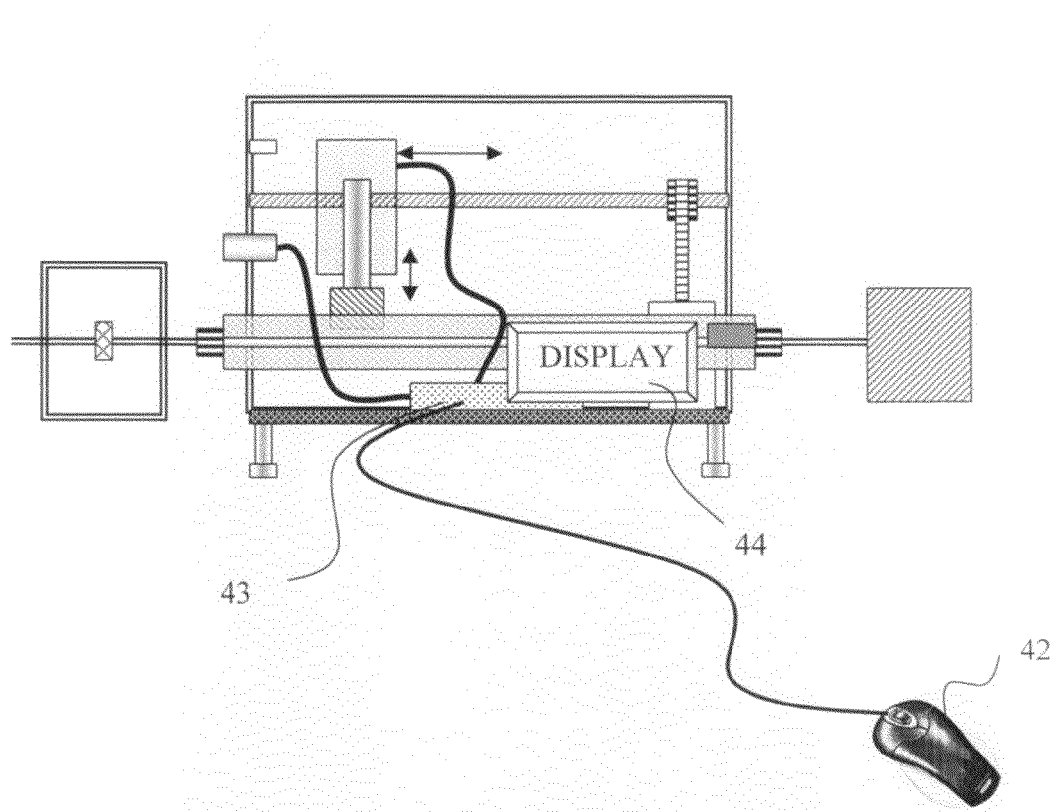
FIGURE 7: Mouse human control interface

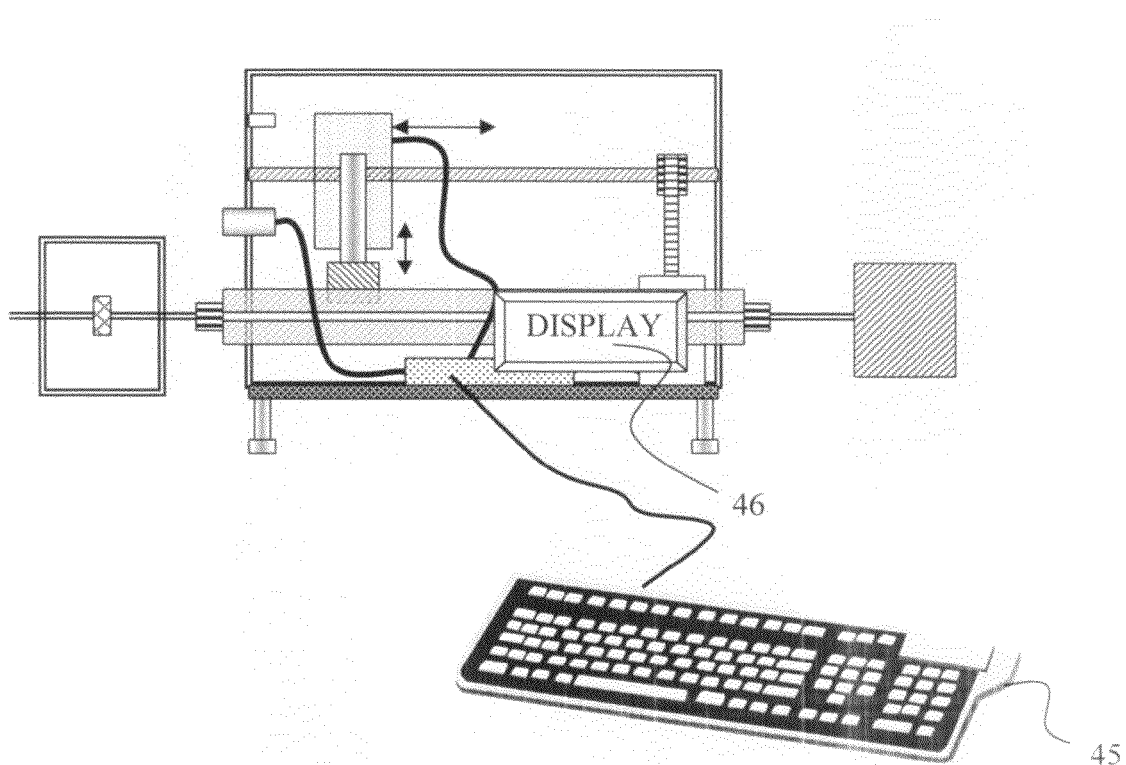
FIGURE 8: Keyboard human control interface

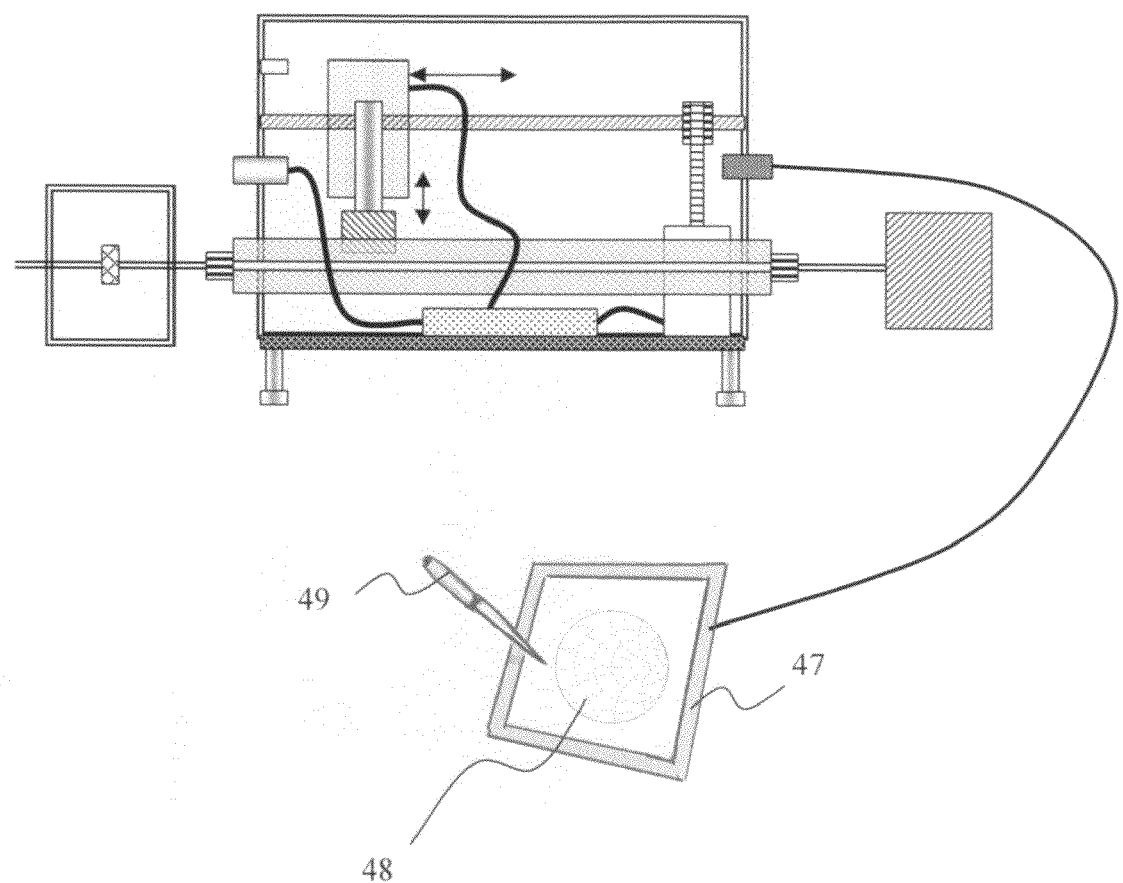
FIGURE 9: Touch-sensitive (tactile) human control interface

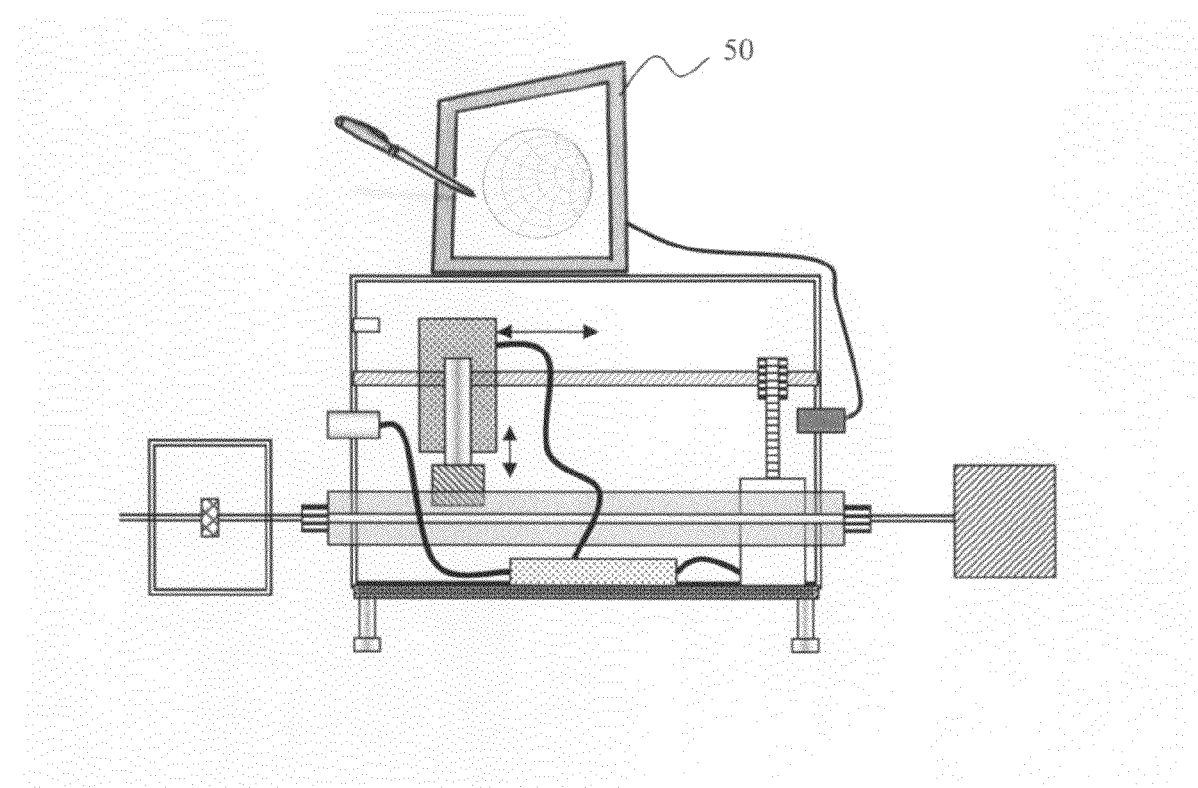
FIGURE 10: Touch-sensitive (tactile) human control interface mount on tuner housing

AUTONOMOUS IMPEDANCE TUNER WITH HUMAN CONTROL INTERFACE

PRIORITY CLAIM

Not Applicable

CROSS-REFERENCE TO RELATED ARTICLES

[1] Product Note 41: "Computer Controlled Microwave Tuner, CCMT", Focus Microwaves Inc., January 1998.

[2] Maury Microwave Corp., "Precision Microwave Instruments and Components Product Catalogue", 2001, page 66.

[3] Tsironis, C. U.S. Pat. No. 6,674,293 "Adaptable Pre-matched tuner system and method".

[4] Product Note 79, "MPT, a universal Multi-Purpose Tuner", Focus Microwaves, October 2004.

[5] "Rabbit", Microprocessor, 8-bit Rabbit Micro-processor series.

[6] Rugged Operator Interface & Mobile Data Terminals, QSI Corporation, QTERM-Z60.

[7] Product Note 82, "VSWR++ iTuner Calibration Routine", Focus Microwaves, January 2007.

[8] "Network Analyzers>PNA Family of Microwave Network Analyzers", Agilent Technologies.

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

This invention relates to variable impedance dependent (load pull or source pull) testing of microwave power transistors using automatic microwave tuners in order to synthesize reflection factors (or impedances) at the input and output of said transistors at the fundamental and various harmonic frequencies.

Modern design of high power microwave amplifiers, oscillators and other active components, used in various communication systems, requires accurate knowledge of the active device's (microwave transistor's) characteristics. In such circuits, it is insufficient and inaccurate for the transistors operating at high power in their highly non-linear regions and close to saturation, to be described using analytical or numerical models only. Instead the devices must be characterized using specialized test setups under the actual operating conditions.

A popular method for testing and characterizing such microwave components (transistors) for high power operation is "load pull" and "source pull". Load pull or source pull are measurement techniques employing microwave tuners (2, 4) and other microwave test equipment (1, 5). The microwave tuners in particular are used in order to manipulate the microwave impedance conditions under which the Device Under Test (DUT, or transistor) is tested (3) [1] (FIG. 1).

A system control computer (9) is needed to communicate (6) with the instruments (5) and the tuners (7, 8). The control computer directs the tuner motors (12, 12a, FIG. 2) and reads data from the instruments, both during the tuner calibration and during the DUT measurement.

When the DUT's are driven into saturation, which is a typical amplifiers operation for highly efficient amplifiers, then they operate in a highly nonlinear range, distort the source signal and create energy at the harmonic frequencies. The appropriate impedance tuner for this operation is a device that is able to create user-defined impedances at the fundamental (Fo) and harmonic frequencies (2Fo, 3Fo, 4Fo . . . ). A tuner allowing a three frequency impedance synthesis and associated calibration and tuning software are integrated into a multi-frequency impedance synthesizer, as described in [4]. For several applications, however, wideband tuners are used, which allow control of the impedance only at the fundamental frequency (Fo), [1, 2].

DESCRIPTION OF PRIOR ART

Impedance synthesis is possible using Impedance Tuners [1]. These tuners are electro-mechanical instruments having as a core structure a low loss parallel plate transmission line (slabline) (10) in which one or more precisely positioned conductive (metallic) or dielectric probes (11) are positioned. If a single probe is controllable at a time using a stepper motor (12, 12a) and gear (13) the tuner covers a wide frequency range and can adjust the impedance only at one frequency, typically called the 'fundamental' frequency (Fo) at which the DUT is tested. If more than one probes (11) are available in the same slabline, (10) or in cascaded slablines, and can be controlled independently [3, 4], then it is possible to adjust impedances at the fundamental and, typically, at harmonic frequencies (2Fo, 3Fo, etc.) but also other frequencies not entire multiples of Fo (FIG. 2). These tuners comprise electronic boards (14) for controlling the motors (12) and a digital interface (15), which allows communication and control from a system control computer PC (16).

In all cases the tuners must be 'calibrated' before the measurement operation. Calibrated means that the tuners must be connected to a vector network analyzer (VNA, PNA) (17) [8] and the scattering parameters (s-parameters) of said tuners (18) must be measured for various tuner 'states', which in fact correspond to various properly selected horizontal and vertical positions of the probe (20) in the slabline (19) [1]. The PC (21) controls (23) the tuner states and communicates (22) with the VNA (17) for collecting s-parameter data (calibration data) and saving in memory files. The measured s-parameters are saved in calibration data files on the hard-disk of the control PC and retrieved during the measurement, in order to associate the measured data with the corresponding impedance and allow circuit designers to select the right circuits in order to obtain the design goals in their products. This process is called 'load-pull' and the results are represented as power, efficiency etc. ISO contours on a Smith Chart [1].

In all previously described cases in order to control the computer position (state) a control computer (16, 21) is required in order to save and retrieve the s-parameter data from the computer memory, where they have been stored during the tuner calibration procedure and instruct the motors to move to certain positions. In other words, even if the tuner is already calibrated, it cannot be used without connection to the control computer; the tuner contains motor control and positioning electronics (14) and needs exact commands on where to set the motors in order to generate the requested impedance. It has to receive the 'move to X,Y' command from the control computer (9, 16), whereby X and Y (or XPOS, YPOS) represent the physical horizontal and vertical position of said tuner probe (11, 20), typically expressed in motor steps, if stepper motors are used (12, 12a), relative to a mechanical "zero" position (12b).

In this invention we propose a truly autonomous stand-alone tuner, which incorporates all necessary hardware, firmware, computing power and memory and appropriate human control interface in form of a control-stick (joy-stick) or a mouse and/or a keyboard or a touch sensitive (tactile) screen, which allows tuner operations, such as synthesizing impedances and correcting for tuner and setup losses without the need of an external control computer. This makes the tuner a truly independent, more versatile and easily transportable and useable instrument.

Such stand-alone tuners may use one, two or three independent probes (11, 20) for the various tasks such as tuning at a single frequency, two or three frequencies correspondingly, or combinations of, all entered directly to the tuner by the said human interface and executed by the on-board micro-processor, computing firmware, memory and electronic motor control.

BRIEF DESCRIPTION OF THE SEVERAL VIEWS OF THE DRAWINGS

The invention and its mode of operation will be more clearly understood from the following detailed description when read with the appended drawings in which:

FIG. 1 depicts prior art, automated load pull test system using impedance tuners.

FIG. 2 depicts prior art, a cross section of wideband electromechanical tuner.

FIG. 3 depicts prior art, setup for calibrating an impedance tuner on a VNA.

FIG. 4 depicts, autonomous impedance tuner.

FIG. 5 depicts, actual photo of autonomous impedance tuner and human control interface (joystick), showing also the alpha-numeric display.

FIG. 6 depicts, menu of selectable firmware options.

FIG. 7 depicts, mouse human control interface.

FIG. 8 depicts, keyboard human control interface.

FIG. 9 depicts, touch sensitive (tactile) human control interface.

FIG. 10 depicts, touch-sensitive (tactile) human control interface mount on tuner housing.

DETAILED DESCRIPTION OF THE INVENTION

The stand-alone autonomous impedance tuner, FIG. 4, comprises, like existing similar slide screw tuners [1-4], a low loss slabline (24) between the test port (25) and the idle port (26). The test port (25) is connected to the DUT (27) by means of a test fixture (28) and the idle port (26) to the source or load (29) of the test setup. The slabline is mounted in a housing (30) which comprises also a guidance mechanism (31) for a number of mobile carriages (32); each said carriage comprises a precise vertical axis (33) holding at its lower end the probe (34) to be inserted in the slabline (24) and a stepper motor (35) allowing controlling the vertical position of said probe inside the slabline. The carriage is driven by a lead screw (36), which is controlled by a second stepper motor (37) thus allowing positioning the probe to an exact horizontal distance from the test port (25). In case of a tuner using more than one probe, said tuner uses two or more carriages with associated probes and lead screws and stepper motors, FIG. 4.

The said tuner of FIG. 4 also comprises an electronic board (38) controlling all other components and functions, beyond moving the motors, comprising: a digital interface (39) for uploading calibration data from a control computer into the tuner's on-board memory and using said data to compute the requested tuner probe positions for synthesizing the requested impedances (tuning). It also comprises a human control interface for controlling all above operations.

The electronic board (38) of said autonomous tuner (FIG. 4) comprises, in addition to the motor control electronics, included in a non-autonomous tuner (FIG. 2), also a microprocessor [5], random access memory (RAM), integrated or external nonvolatile memory and input/output ports to the computer port, motor control boards and human control interface.

The status of said tuner is computed in said on-board processor and displayed on the alpha-numeric digital display (38a). Said display has at least two lines of information, which can be allocated either for displaying data, such as motor (probe) positions, or impedances or data files to be loaded or macro routines to be activated. Scrolling through the menus and digits on said digital display allows selecting files, routines or numbers to be entered using an additional "select" contact. Said digital display is used either by the joystick human control interface, or the mouse or the keyboard. The touch-sensitive (tactile) screen, FIGS. 9, 10, does not need the digital display in order to operate said tuner.

Uploading calibration data from a control computer, used to calibrate the tuner on a network analyzer is possible using a specific digital interface (39) between the on-board microprocessor inside the tuner (38) and the control computer. Said tuner must therefore provide for such an interface for the purpose of calibration and data uploading (39). Typical processors use serial (RS-232) or USB or LAN digital interfaces, FIG. 4.

In order to accomplish the "tuning" task i.e. calculating the required probe positions for any user defined impedance, said on-board tuner electronics must include a digital micro-processor, such as the commonly used "Rabbit" processor chip [5]. The micro-processor must be loaded with appropriate software (firmware), which allows the micro-processor to communicate with an attached human control interface through an internal digital interface, in order to receive and execute pre-programmed commands, launch algorithms, compute data and convert the result to executable motor moving instructions (FIGS. 5, 7, 8).

A constant VSWR test routine [7] allows activating an impedance synthesis algorithm, which then computes said tuner's probe positions such as to create a circle of constant reflection factor (or VSWR) on the Smith chart and scan all impedances lying on said circle and control said motors of said tuner in order to move said probe to the appropriate positions, corresponding to said constant reflection factor and scan all phases from 0 to 360 degrees on said Smith chart.

A joystick human control interface (40) has four contact directions and an additional "select" contact (41) is required for selecting among displayed options, FIG. 5. The four basic contact directions of said joystick allow moving the tuner probe left-right-up-down, thus allowing positioning everywhere inside the slabline. However if the joystick operation is limited to those four contacts, then said tuner is no more than a motorized manual tuner, without on-board intelligence. In order to allow more functionality at least an additional "select" (41) button is required, which allows navigating through a number of pre-programmed menus, FIG. 6, in the firmware and choosing more advanced operations, such as selecting the axis to move (in case of multi-probe tuners), selecting tuner and setup calibration data to be activated in memory (since the on-board memory can hold tuner and setup calibration data for more than a single frequency), change display of real and imaginary impedance component or reflection factor and phase or enter target impedances and activate the "tuning" algorithm, initialize the tuner and more.

A mouse human interface (42), FIG. 7, can be used to control said stand-alone impedance tuner in a similar manner as said joystick. The mouse must be connected, typically via a USB digital interface (43) with the on-board processor and said firmware runs routines accepting mouse messages and converts them to programming instructions; said instructions are then converted to either motor movements or scroll down menus on the tuner digital display (44); said mouse buttons are then clicked to select among the available menus in order to activate all functions associated with the joystick operation.

A keyboard (45), FIG. 8, can be used as human interface for the stand-alone tuner in a similar manner as the joystick and the mouse. In fact a keyboard allows horizontal and vertical motor movement using the four cursors, exactly as the joystick and in addition it allows entering numeric values into the digital display (46) easier than the joystick and the mouse, which need to scroll each number up or down and select digit by digit, in order to enter a given value for a function value, such as target impedance.

A touch-sensitive (tactile) active LCD screen (47) [6] represents a more expensive and more attractive human interface to be used for controlling said impedance tuner, FIG. 9. Such screens are available with full programming capability. Said screens can be programmed to represent either an alpha-numeric array for entering numbers and selecting menus, or a set of horizontal or vertical arrows, which will allow direct motor control, when activated by touching the screen either by one's finger or an appropriate stylus (49). The main interest of said tactile screen is the fact that it can be programmed to show a Smith chart (48) and read the position of the stylus on it, when touched. Said position is then easily converted into coordinates and associated impedance and can then activate the tuning algorithm. This is an intuitive GUI (graphical user interface) and a convenient way of entering target impedances into the on-board processor for the tuner to synthesize. The active screen can also be integrated into the computer body either permanently or as a flip-on option (50), FIG. 10.

The present embodiment of this invention can easily be adapted to use other types of electro mechanical impedance tuners and human control interfaces; this shall not limit the basic concept and the overall scope of the present invention, of using a stand-alone intelligent impedance tuner equipped with a human control interface for autonomous operation.

What I claim as my invention is:

1. An autonomous stand-alone electromechanical impedance tuner, comprising:
   a microwave impedance synthesis algorithm stored in a non-transitory memory that synthesizes user defined impedance patterns in the reflection factor plane/Smith chart, and
   wherein said tuner comprises a low loss slotted airline/slabline between a test port and an idle port, one or more metallic probes that are positioned inside the slot of said slabline and can be moved horizontally and vertically into the slabline using remotely controlled electric motors and motor drive circuitry;
   an on-board digital processor with associated firmware and associated memory for the purpose of uploading calibration data;
   a digital alpha-numeric display showing the tuner state and response, and controlled through a human control interface, said human control interface allowing a user to activate said impedance synthesis algorithm, which then computes said tuner's probe positions to create said user-defined pattern on the Smith chart and scans all impedances lying on said pattern and controls said motors of said tuner in order to move said probes to the appropriate positions to synthesize a desired impedance.

2. An autonomous stand-alone electromechanical impedance tuner as in claim 1, where said pattern is a concentric circle on the Smith chart with a radius defined by the user, said radius corresponding to a constant reflection factor, thus allowing scanning all phases from 0 to 360 degrees.

3. An autonomous stand-alone impedance tuner as in claim 1, wherein said human control interface comprises a joystick, wherein the joystick is either integral to the tuner, or externally coupled to the tuner.

4. An autonomous stand-alone impedance tuner as in claim 3, where said human control interface is a digital mouse, connected with the main processor inside said tuner and allowing the same operations as said joystick.

5. An autonomous stand-alone impedance tuner as in claim 3, where said human control interface is a computer keyboard connected with the main processor inside said tuner and allowing the same operations as said joystick.

6. An autonomous stand-alone impedance tuner as in claim 3, where said human control interface is a touch-sensitive/tactile digital screen, connected with the main processor inside said tuner and allowing the same operations as said joystick; wherein said tactile digital screen allows displaying a Smith Chart and allows entering graphically the target impedance for the tuner by pointing to it with a pointer stylus.

7. A method for using an autonomous stand-alone electromechanical impedance tuner, said tuner comprising an input port and an output port and a slabline between said ports and one or more conductive capacitive probes remotely insertable into the slot of said slabline, wherein the probes can be moved horizontally and vertically into the slabline using remotely controlled electric motors and motor drive circuitry; an on-board digital processor with associated firmware and associated memory for the purpose of uploading calibration data; a digital alpha-numeric display showing the tuner state and response; and a human control interface that activates an impedance synthesis algorithm, the method comprising:
   synthesizing, using the microwave impedance synthesis algorithm stored in a non-transitory memory, user defined impedance pattern in the reflection factor plane/Smith chart;
   controlling the probe positions with a human control interface coupled to the tuner; and
   activating tuning routines from a menu with the human control interface.

8. A method as in claim 7, wherein the human control interface comprises a tactile screen coupled to said tuner, and wherein the tactile screen allows a user to activate tuning routines, including point-and-tune on a Smith chart.

9. A method as in claim 7, wherein the human control interface comprises a keyboard connected to said tuner, allowing a user to enter target impedances into the tuner firmware, or activate tuning routines from a menu.

10. A method as in claim 7, wherein the human control interface comprises a joystick, wherein the joystick is either integral to the tuner, or externally coupled to the tuner, and further comprises the method steps:
   controlling the probe positions with the joystick; and
   activating tuning routines from a menu with the joystick.

* * * * *